United States Patent

Chen et al.

[11] Patent Number: 5,977,598
[45] Date of Patent: Nov. 2, 1999

[54] HIGH LOAD RESISTANCE IMPLEMENTED IN A SEPARATE POLYSILICON LAYER WITH DIFFUSION BARRIER THEREIN FOR PREVENTING LOAD PUNCH THROUGH THEREFROM

[75] Inventors: Chih-Ming Chen, Tainen; Wen-Ying Wen; Chun Hung Peng, both of Hsinchu, all of Taiwan

[73] Assignee: Winbond Electronics Corporation, Hsinchu, Taiwan

[21] Appl. No.: 08/935,869

[22] Filed: Sep. 23, 1997

[51] Int. Cl.$^6$ ............ H01L 29/76; H01L 29/74; H01L 31/062; H01L 31/113
[52] U.S. Cl. ............ 257/380; 257/536; 257/537; 257/538; 257/903
[58] Field of Search ............ 257/380, 536, 257/537, 538, 756, 767; 438/182, 210, 238, 383, 384, 385, 382

[56] References Cited

U.S. PATENT DOCUMENTS 5,108,945  4/1992  Matthews ............ 438/384
5,168,076  12/1992  Godinho et al. ............ 438/384
5,751,050  5/1998  Ishikawa et al. ............ 257/536

*Primary Examiner*—Tom Thomas
*Assistant Examiner*—William Hughes
*Attorney, Agent, or Firm*—Bo-In Lin

[57] ABSTRACT

This invention discloses a memory cell that has a first polysilicon, which functions as a gate. The memory cell further includes a first TEOS oxide layer overlying the first polysilicon and a plurality of via-1 openings exposing the first polysilicon therein. The memory cell further includes a patterned second polysilicon layer overlying the first TEOS oxide layer and filling the via-1 openings thus contacting the gate wherein the patterned second polysilicon containing dopant ions for functioning as a connector for the memory cell. The memory cell further includes a second TEOS oxide layer overlying the connector includes a plurality of via-2 openings for exposing the connector therein. The memory cell further includes a silicide barrier layer disposed in the via-2 openings. And, The memory cell further includes a patterned third polysilicon layer overlying the second TEOS oxide layer and in contact with the silicide for contacting the connector thereunder wherein the patterned third polysilicon layer containing dopants therein to function as a load resistor for the memory cell.

4 Claims, 5 Drawing Sheets

HIGH LOAD RESISTANCE IMPLEMENTED IN A SEPARATE POLYSILICON LAYER WITH DIFFUSION BARRIER THEREIN FOR PREVENTING LOAD PUNCH THROUGH THEREFROM

BACKGROUND OF THE INVENTION

1. Field of the Invention

This invention relates generally to the cell structure and fabrication method of the memory cell and arrays. More particularly, this invention relates to a novel and improved cell structure and fabrication process including a novel silicide segment as polysilicon via replacement thus functions as diffusion barrier to prevent reduction of the load resistance from diffusion of the heavily doped regions whereby a polysilicon load punch through can be prevented even with reduced length of the polysilicon load resistor.

2. Description of the Prior Art

A major difficulty faced by those who are attempting to reduce the size of a memory cells is a length requirement of a polycrystalline silicon layer employed as a load resistor for the memory cell. For example, the load resistors used in a memory cells as pull-up resistors must have high value of resistance to prevent a punch-through. As these resistors are formed as part of the polycrystalline layer wherein portions of the layer are employed as connector which are therefore doped with higher dopant concentration to provide lower connector resistance. Extra length of polysilicon layer becomes a design requirement due to the concern of lateral diffusion from these heavily doped regions during the thermal cycles thus causing a reduction of resistance. The length requirement thus hinders the size of the cell to be further miniaturized. Due to the concern of resistance reduction resulting from lateral diffusion, the potential problem of polysilicon load punch through also becomes a design limitation particularly with memory array of smaller cell size.

In order to better understand the background of the invention, a conventional method for implementing a load resistor on a polycrystalline layer is first described according to FIGS. 1A to 1C. In FIG. 1A, a cross sectional view is illustrated wherein a sequence of standard memory cell manufacture processes are performed on a substrate to carry out the processing steps of isolation, well formation and $V_{th}$ dose implantation for adjusting the threshold voltage. A gate oxide layer is grown followed by depositing the first polycrystalline silicon layer and optionally a silicide deposition as shown in FIG. 1A. Referring to FIG. 1B, the gate region is patterned followed by a LDD and a source/drain (S/D) formation process. A TEOS oxide layer is then deposed on the top surface and the polysilicon via is formed.

Referring to FIG. 1C, a second polysilicon layer is formed followed by a blank implant with a low dose implanting ions to adjust the load resistance of the second polysilicon layer. The second polysilicon layer is then patterned wherein part of the second polysilicon layer, i.e., polysilicon (2), will be utilized as a connector and the remaining portion of that layer is applied as a load resistor. The portion utilized as a connector is more heavily doped. The sequence of implant the connector and the patterning of the second polysilicon layer can be exchanged. The processing steps and the resulting configuration generate a particular problem for the load resistor, i.e., the N⁻ segment disposed between two more heavily doped N⁺ segments. Namely, a lateral diffusion of the implanted ions in the more heavily N⁺ segment will cause the implanted ions to diffuse into the load resistor segment which is more lightly doped N⁻ segment. The resistance of the load resistor will be adversely reduced and a potential problem of punch through may be resulted from the load resistance reduction. In order to assure sufficient resistance is maintained after the thermal cycles, extra length of the polysilicon layer (2) is provided in anticipation of the reduction of the effective length caused by lateral diffusion during high temperature cycles in subsequent processing steps. Therefore, size reduction of a memory cell is limited by the length of the second polysilicon layer which is employed as load resistor. A minimum length is required for this second polysilicon layer in order to prevent the occurrence of a punch through which may be induced during the thermal cycles in the manufacturing process leading to the lateral diffusion and resistance reduction of the load resistor.

In U.S. Pat. No. 5,172,211, entitled "High Resistance Polysilicon Load Resistor" (issued on Dec. 15, 1992), Godinho et al. disclose a load resistor used in a semiconductor integrated circuit which consists of two portions of conductive material, typically strips of either a silicide or a composite polycrystalline silicon layer and silicide layer formed thereon. The strips are formed on a semiconductor substrate and separated from each other by a selected distance. An electrically conductive dopant diffusion barrier is formed on the first and second portions of conductive material. A polycrystalline silicon layer is then placed on the structure such that one portion of the polycrystalline silicon material is in ohmic contact through the diffusion barrier with the first portion of conductive material and the other portion of the polycrystalline silicon material is in ohmic contact through the diffusion barrier with the second portion of the conductive material. The diffusion barrier layer serves to prevent any dopant from the conductive material from diffusing into the polycrystalline silicon, i.e., polysilicon, material thereby allowing the polycrystalline silicon material to function as a load resistor having a high resistance.

The load resistor disclosed by Gadinho et al. provides a solution to maintain the resistance of the load resistor by forming dual separated polysilicon strips and implementing a diffusion barrier between these strips thus creating a high resistance load resistor which being affected by lateral diffusion of dopant into the resistor. However, Gadinho's device requires more complicate processing steps in forming two separate polysilicon strips and then a diffusion barrier between them. The production costs for implementing the structural features is increased due to the more complicate manufacturing processes. Product yield and reliability of the memory device may also be adversely affected when more complicate processing steps are performed.

Therefore, a need still exists in the art of memory cell design and manufacture to provide a novel cell structure and manufacture process to resolve the above difficulties. It is desirable that the novel memory cell architecture can significantly relieve the limitation that a smaller memory cell often encounter a punch through problem at the polysilicon load. By resolving this particular limitation would allow the cell size to be further reduced. Additionally, it is desirable that this novel cell structure and manufacture process would be simple and convenient to carry out such that the quality of the transistor array and production cost would not be adversely affected by a more complicate manufacture process.

SUMMARY OF THE PRESENT INVENTION

It is therefore an object of the present invention to provide a novel and improved manufacture process and cell structure for a memory cell where a separate polysilicon layer is implemented as the load resistor which can be maintained at a high load resistance without requiring the increase of the memory cell size such that the aforementioned difficulties and limitations encountered in the prior art can be overcome.

Specifically, it is an object of the present invention to provide a novel and improved manufacture process and cell structure for a load resistor wherein a new layer structure is implemented by a separate silicide layer in the polysilicon vias as diffusion barrier and a separate polysilicon layer as load resistor thus providing a load resistor therein such that a high resistance for the load resistor can be maintained without being affected by lateral diffusion during the thermal cycles in the manufacture process whereby extra-length of polysilicon layer provided to compensate the lateral diffusion effect is no longer necessary.

Another object of the present invention is to provide a novel and improved manufacture process and cell structure for a for a load resistor wherein a new layer structure is implemented by a adding separate silicide layer in the polysilicon vias as diffusion barrier and a separate polysilicon layer as load resistor thus providing a load resistor therein such that a load resistor with constant high resistance is provided without requiring high precision manufacture processes for making a complicate structure whereby substantial increase in production time and cost can be avoided.

Another object of the present invention is to provide a novel and improved manufacture process and cell structure for a load resistor wherein a new layer structure is implemented by adding a separate silicide layer in the polysilicon vias as diffusion barrier and a separate polysilicon layer as load resistor thus providing a load resistor therein such that the cell size can be further reduced without being limited by a longer polysilicon layer as required in the prior art device whereby memory array of higher cell density can be achieved.

Briefly, in a preferred embodiment, the present invention discloses a method to manufacture a connector and a load resistor for a memory cell, with a first polysilicon as gate for the memory cell. The method includes the steps of (a) forming a first TEOS oxide layer overlying the first polysilicon and etching a plurality of via-1 openings for exposing the first polysilicon therein; (b) forming a second polysilicon layer overlying the first TEOS oxide layer and filling the via-1 openings for contacting the gate followed by a connector implant and patterning the second polysilicon layer to form the connector for the memory cell; (c) forming a second TEOS oxide layer overlying the connector etching a plurality of via-2 openings for exposing the connector therein; (d) filling the via-2 openings with a silicide as a barrier layer therein; and (e) forming a third polysilicon layer overlying the second TEOS oxide layer and in contact with the silicide for contacting the connector thereunder followed by a load resistor implant and patterning the third polysilicon layer to form the load resistor for the memory cell.

In a preferred embodiment, this invention also discloses a memory cell having a first polysilicon as a gate. The memory cell further includes a first TEOS oxide layer overlying the first polysilicon and a plurality of via-1 openings exposing the first polysilicon therein. The memory cell further includes a patterned second polysilicon layer overlying the first TEOS oxide layer and filling the via-1 openings thus contacting the gate wherein the patterned second polysilicon containing dopant ions for functioning as a connector for the memory cell. The memory cell further includes a second TEOS oxide layer overlying the connector includes a plurality of via-2 openings for exposing the connector therein. The memory cell further includes a silicide barrier layer disposed in the via-2 openings. The memory cell further includes a patterned third polysilicon layer overlying the second TEOS oxide layer and in contact with the silicide for contacting the connector thereunder wherein the patterned third polysilicon layer containing dopants therein to function as a load resistor for the memory cell.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1A:
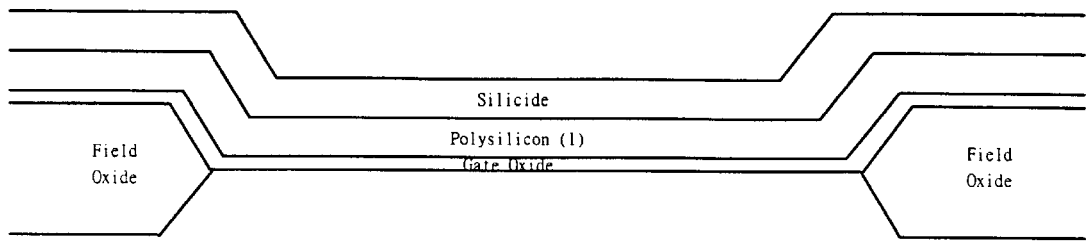
FIGS. 1A to 1C are a series of cross sectional views for illustrating the processing steps applied to manufacture a prior art memory device with the load resistor implemented as a part of a polysilicon connector.
Figure 1B:
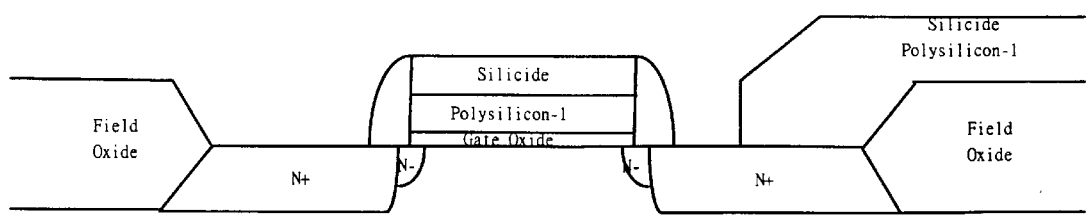
Figure 1C:
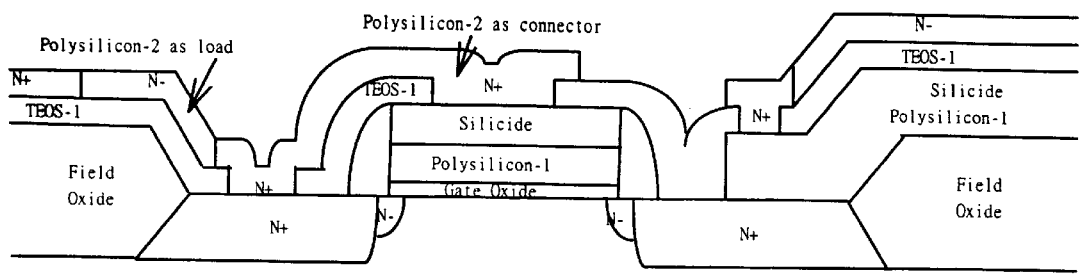
Figure 2A:
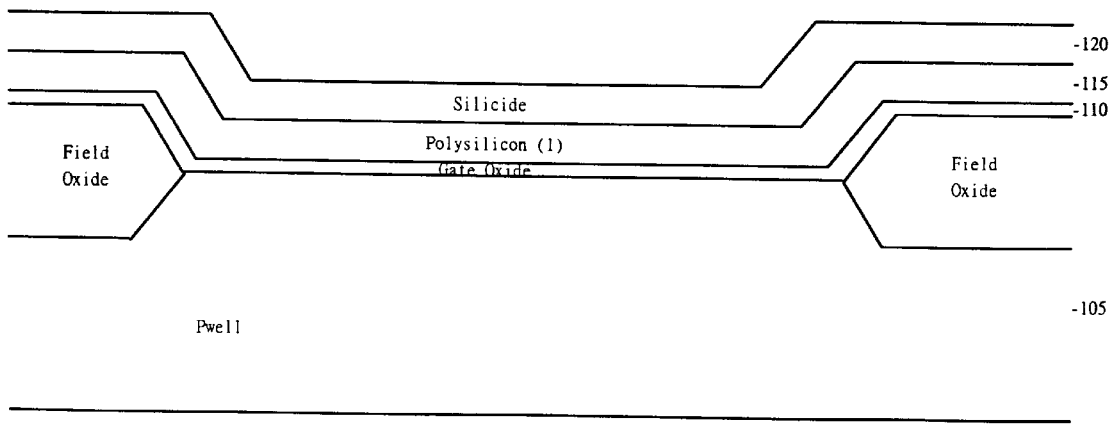
FIGS. 2A to 2F a series of cross sectional views for illustrating the processing steps applied to manufacture a memory device of the present invention with a separate polysilicon layer implemented as the load resistor.

Referring to FIGS. 2A to 2F for a sequence of cross sectional views for illustrating the processing steps of a memory cell 100 of the present invention. FIG. 2A is cross sectional view similar to FIG. 1A employed for manufacturing the prior art cells. In FIG. 2A, a cross sectional view is shown wherein a sequence of standard memory cell manufacture processes are performed on a substrate 105 to carry out the processing steps of isolation, well formation and $V_{th}$ dose implantation for adjusting the threshold voltage. A gate oxide layer 110 of a thickness of about 70 Angstroms is grown followed by depositing the first polycrystalline silicon layer 115 of about 1000 Angstroms and optionally a silicide deposition to form the silicide layer 120 of a thickness about 1200 Angstroms as shown in FIG. 2A.

Figure 2B:
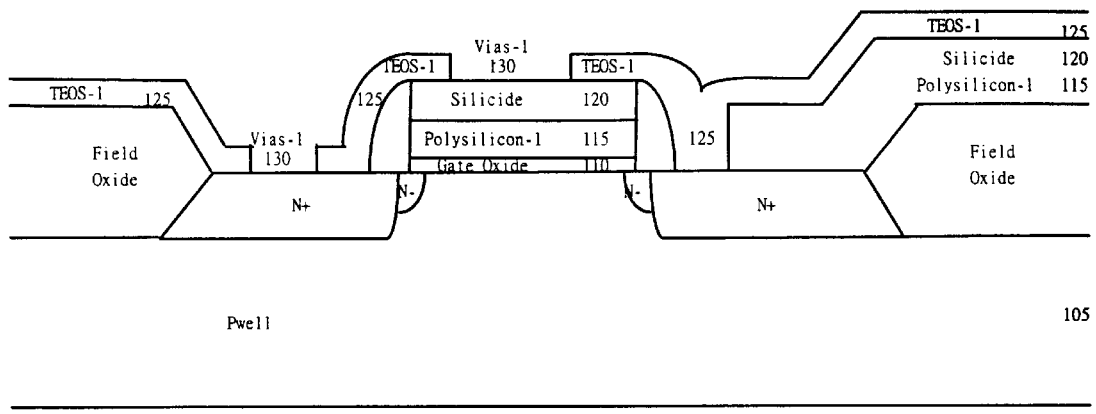
Figure 2C:
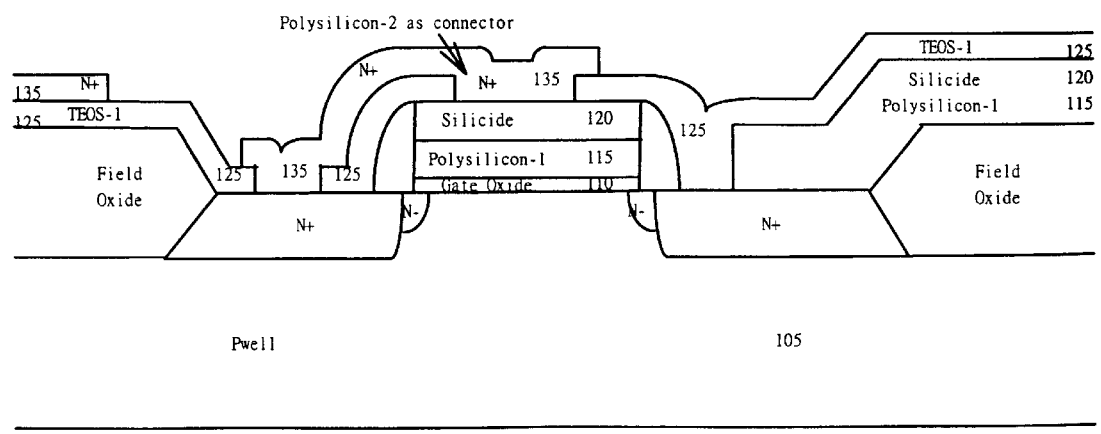

Referring to FIG. 2B, after the TEOS-1 oxide layer 125 of a thickness about 1500 Angstroms is deposited, the polysilicon vias 130 are opened. Referring to FIG. 2C, the second polysilicon layer, i.e., ploy-2 layer 135 with a thickness of about 1000 Angstroms is deposited and then implanted blankly with a higher dopant concentration to adjust the connector resistance. The polysilicon-2 layer 135 is then patterned as connector for the memory cell 100.

Figure 2D:
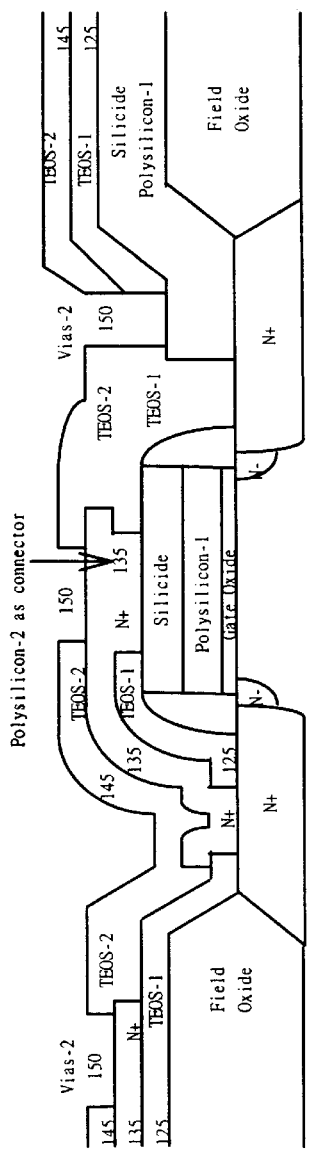
Figure 2E:
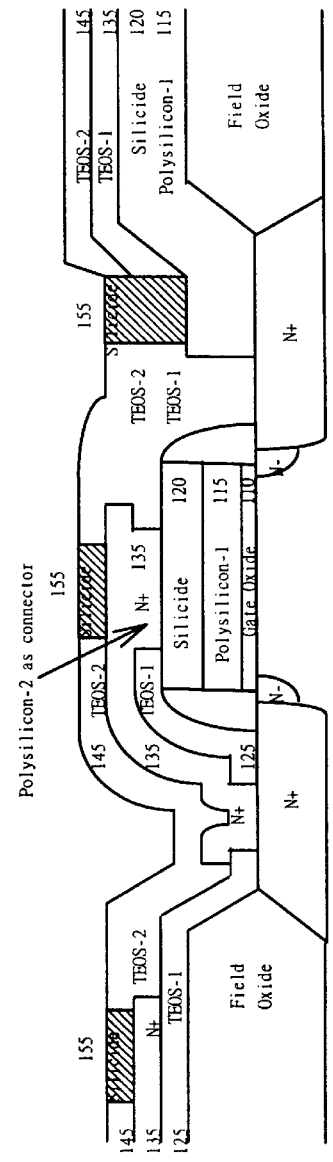

Referring to FIG. 2D, the TEOS-1 oxide layer 125 with a thickness of about 1500 Angstroms is deposited by the use of a chemical vapor deposition (CVD) process performed at a temperature of 700° C. for about thirty minutes. Then, the polysilicon vias-2 150 are opened. Referring to FIG. 2E, a silicide layer 155 is formed. The silicide layer 155 is formed by applying a CVD deposition of Ti/TiN with a thickness of approximately 1600 Angstroms at a temperature of about 150° C. and a tungsten layer of about 8000 Angstroms at a temperature of about 400° C. at a pressure of about 40 Torr for about fifty seconds. The TiN layer is a barrier layer while the Ti layer is an adhesive layer for tightly adhere to the tungsten layer to lower the contact resistance. After etching back the Ti/TiN and the tungsten layers by the use of $SF_6/Ar$ etchant to remove the silicide on the TEOS-2 layer, the polysilicon vias 130 are now filled with a silicide layer 135. The process of silicide deposition can be carried out by employing a Novellus Concept-1 System and the etching process can be performed by employing a LAM-4720 System.

Figure 2F:
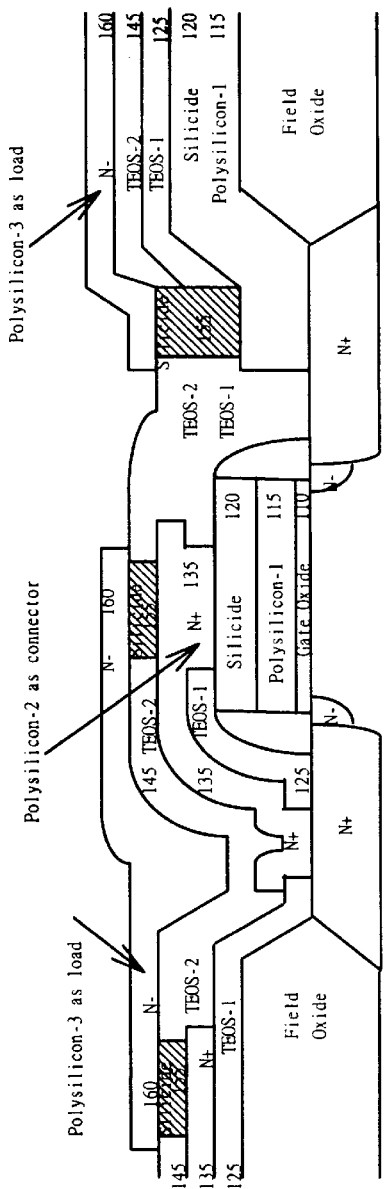

Referring to FIG. 2F, a third polysilicon layer, i.e., the polysilicon-3 layer 160 with a thickness of about 750 Angstroms is deposited and then the resistance is adjusted by applying a light implant for use as a load resistor for the memory cell. The polysilicon-3 layer 160 is then patterned as the load resistor. Since the vias-2 are now filled with a barrier silicide layer, the potential difficult of punch through, particularly for smaller memory cells, are now resolved. The cell size can be safely reduced without being limited by the concerns that punch through may occur due to reduction of load resistance when the memory cells become smaller. The processes in forming extra layers of TEOS-2, polysilicon-3 and the opening of via-3 are standard procedures commonly employed in the manufacture of integrated circuits applied in the industry. Standard process is also applied to form the silicide layer. Therefore, the advantages of this invention can be conveniently implemented without adding extra difficult or complex manufacture processes and the benefits of this invention can gained by applying standard and manufacture processes which are well known and can be precisely controlled. The device is further processed with TEOS oxide deposition and BPSG insulation layer formation followed by contact opening and metal line formation, and finally passivation layer formation. These steps are standard integrated circuit (IC) manufacture processes which are not described here in details for the sake of brevity and clarity.

According to FIG. 2F, this invention discloses a memory cell having a first polysilicon 115 as a gate. The memory cell further includes a first TEOS oxide layer 125 overlying the first polysilicon 115 and a plurality of via-1 openings 130 exposing the first polysilicon 115 therein. The memory cell further includes a patterned second polysilicon layer 135 overlying the first TEOS oxide layer 125 and filling the via-1 openings 130 thus contacting the gate 115 wherein the patterned second polysilicon 135 containing dopant ions for functioning as a connector for the memory cell. The memory cell further includes a second TEOS oxide layer 145 overlying the connector 135 includes a plurality of via-2 openings 150 for exposing the connector 135 therein. The memory cell further includes a silicide barrier layer 155 disposed in the via-2 openings 150. The memory cell further includes a patterned third polysilicon layer 160 overlying the second TEOS oxide layer 145 and in contact with the silicide 155 for contacting the connector 135 thereunder wherein the patterned third polysilicon layer 160 containing dopants therein to function as a load resistor for the memory cell. In a preferred embodiment, the silicide barrier layer 155 containing materials formed with Ti/TiN and tungsten annealed at an elevated temperature. In another preferred embodiment, the memory cell having a cell size ranging from 0.2 to 1.0 micrometer and the connector having a length ranging from 0.2 to 0.8 micrometer and the load resistor having a length ranging from 0.2 to 0.8 micrometer having a resistivity greater than a resistivity of the connector.

In summary, this invention discloses a memory cell which comprises a patterned second polysilicon layer 135 in electrical contact with a gate 115 functioning as a connector. The memory cell further includes a barrier layer 155 overlying the connector. The memory cell further includes a patterned third polysilicon layer 160 above the barrier layer functioning as a load resistor. In a preferred embodiment, the barrier layer including a silicde barrier 155 disposed in a plurality via openings 150 in an insulation layer 145 overlying the connector 135.

According to above description for FIGS. 2A to 2F, a method for manufacturing a connector and a load resistor for a memory cell is disclosed in this invention. The memory cell includes a first polysilicon 115 as gate. The method of manufacturing the connector and the load resistor includes the steps of (a) forming a first TEOS oxide layer 125 overlying the first polysilicon 115 and etching a plurality of via-1 openings 130 for exposing the first polysilicon 115 therein; (b) forming a second polysilicon layer 135 overlying the first TEOS oxide layer 125 and filling the via-1 openings 130 for contacting the gate 115 followed by a connector implant and patterning the second polysilicon layer to form the connector 135 for the memory cell; (c) forming a second TEOS oxide layer 145 overlying the connector 135 etching a plurality of via-2 openings 150 for exposing the connector 135 therein; (d) filling the via-2 openings 150 with a silicide 155 as a barrier layer therein; and (e) forming a third polysilicon layer 160 overlying the second TEOS oxide layer 145 and in contact with the silicide 155 for contacting the connector 135 thereunder followed by a load resistor implant and patterning the third polysilicon layer to form the load resistor 160 for the memory cell. In a preferred embodiment, the silicide as a barrier layer 155 is formed by depositing a Ti/TiN layer followed by depositing a tungsten layer and applying an annealing process at an elevated temperature followed by an etching process to remove the silicide from the second TEOS oxide layer 145. In another preferred embodiment, the memory cell is manufactured with a cell size ranging from 0.2 to 1.0 micrometer and the connector is patterned to have a length ranging from 0.2 to 0.8 micrometer and the load resistor is patterned to have a length ranging from 0.2 to 0.8 micrometer having a resistivity greater than a resistivity of the connector.

Figure 3:
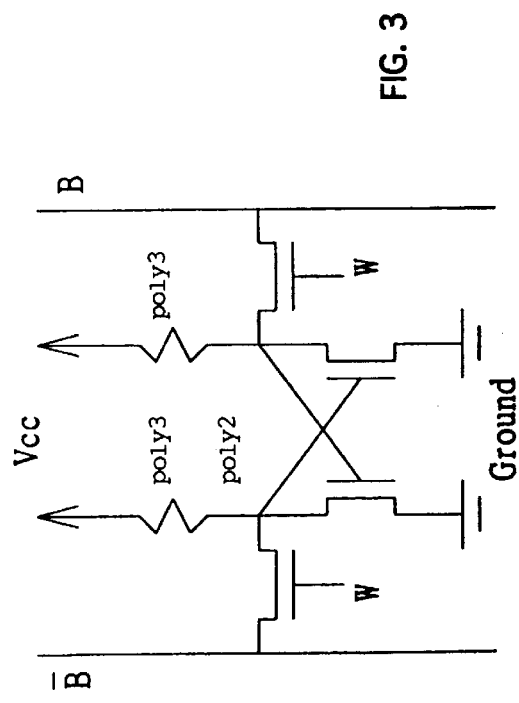
FIGS. 3 is a circuit diagram showing the equivalent circuit of the memory cell implemented with the novel cell structure provided with an improved load resistor.

An equivalent circuit diagram is shown in FIG. 3 when M1 MOS is in ON state, and M2 is in OFF state. Most of the voltage drop of Vcc is on the T1 load. Under this condition, the polysilicon load resistor of extra length still functions properly and no breakdown phenomenon is experienced in actual operational condition. By providing a reliable load resistor with high resistance implemented with the polysilicon-2 layer 140 the length of the second polysilicon layer 140 can be reduced and maintain a high load resistance. The cell size can be miniaturized without be limited by a certain length requirement of the second polysilicon layer as that encountered in a prior art configuration.

Therefore, the present invention provides a novel and improved manufacture process and cell structure for a memory cell where a high load resistance provided by a load resistor. The high load resistance can be maintained without requiring a longer polysilicon length whereby the difficulties and limitations encountered in the prior art are overcome. Specifically, a novel and improved manufacture process and cell structure for a load resistor are provided by this invention wherein a new layer structure is implemented by a separate silicide layer in the polysilicon vias as diffusion barrier and a separate polysilicon layer as load resistor. A load resistor with a high resistance for the load resistor is provided wherein a high load resistance can be maintained without being affected by lateral diffusion during the thermal cycles in the manufacture process whereby extra-length of polysilicon layer provided to compensate the lateral diffusion effect is no longer necessary. Furthermore, the load resistor with constant high resistance is provided without requiring high precision manufacture processes for maling a complicate structure whereby substantial increase in production time and cost can be avoided. Finally, by adding a separate silicide layer in the polysilicon vias as diffusion barrier and a separate polysilicon layer as load resistor thus providing a load resistor therein such that the cell size can be further reduced without being limited by a longer polysilicon layer as required in the prior art device whereby memory array of higher cell density can be achieved.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A memory cell having a first polysilicon as a gate comprising:

a first TEOS oxide layer overlying said first polysilicon and a plurality of via-1 openings exposing said first polysilicon therein;

a patterned second polysilicon layer overlying said first TEOS oxide layer and filling said via-1 openings thus contacting said gate wherein said patterned second polysilicon containing dopant ions for functioning as a connector for said memory cell;

a second TEOS oxide layer overlying said connector includes a plurality of via-2 openings for exposing said connector therein;

a silicide barrier layer disposed in said via-2 openings; and a patterned third polysilicon layer overlying said second TEOS oxide layer and in contact with said silicide for contacting said connector thereunder wherein said patterned third polysilicon layer containing dopants therein to function as a load resistor for said memory cell.

2. The memory cell of claim 1 wherein:

said silicide barrier layer containing materials formed with Ti/TiN and tungsten annealed at an elevated temperature.

3. The memory cell of claim 1 wherein:

said memory cell having a cell size ranging from 0.2 to 1.0 micrometer and said connector having a length ranging from 0.2 to 0.8 micrometer and said load resistor having a length ranging from 0.2 to 0.8 micrometer having a resistivity greater than a resistivity of said connector.

4. A memory cell comprising:

a patterned polysilicon layer in electrical contact with a gate of said memory cell functioning as a connector;

a barrier layer overlying said connector;

a patterned second polysilicon layer above said barrier layer functioning as a load resistor; and said barrier layer including a silicide barrier disposed in a plurality via openings in an insulation layer overlying said connector.

* * * * *